United States Patent
Ng et al.

(10) Patent No.: US 7,315,119 B2
(45) Date of Patent: Jan. 1, 2008

(54) LIGHT-EMITTING DEVICE HAVING A PHOSPHOR PARTICLE LAYER WITH SPECIFIC THICKNESS

(75) Inventors: Kee Yean Ng, Taman Inderawasih (MY); Kheng Leng Tan, Bukit Jambul Indah (MY); Wen Ya Ou, Tanjung Tokong (MY)

(73) Assignee: Avago Technologies IP (Singapore) Pte Ltd

( * ) Notice: Subject to any disclaimer, the term of this patent is extended or adjusted under 35 U.S.C. 154(b) by 307 days.

(21) Appl. No.: 10/841,755

(22) Filed: May 7, 2004

(65) Prior Publication Data

US 2005/0248271 A1    Nov. 10, 2005

(51) Int. Cl.
  *H01J 1/62* (2006.01)
(52) U.S. Cl. .................. 313/512; 313/498; 313/506
(58) Field of Classification Search ......... 313/498–512
  See application file for complete search history.

(56) References Cited

U.S. PATENT DOCUMENTS 5,653,830 A * 8/1997 Fleig et al. ................. 156/67
2002/0185965 A1* 12/2002 Collins et al. ............... 313/501
2004/0090180 A1*  5/2004 Shimizu et al. ............. 313/512
2004/0104391 A1*  6/2004 Maeda et al. ................ 257/79
2004/0145312 A1*  7/2004 Ouderkirk et al. .......... 313/512
2004/0263073 A1* 12/2004 Baroky et al. .............. 313/512

* cited by examiner

Primary Examiner—Joseph Williams
Assistant Examiner—Bumsuk Won

(57) ABSTRACT

A light emitting device having a die that includes a light source that generates light of a first wavelength and a layer of phosphor particles covering the die is disclosed. The phosphor particles convert a portion of the light of the first wavelength to light of a second wavelength. The light source can be fabricated by attaching the light source to a substrate, and converting the light source by applying a light converting layer that includes a volatile carrier material and particles of a phosphor that convert light of the first wavelength to light of the second wavelength over the light source. The volatile carrier material is then caused to evaporate leaving a layer of the phosphor particles over the light source. A binder material can be incorporated in the volatile carrier for binding the phosphor particles to one another after the volatile carrier material is evaporated.

8 Claims, 4 Drawing Sheets

LIGHT-EMITTING DEVICE HAVING A PHOSPHOR PARTICLE LAYER WITH SPECIFIC THICKNESS

FIELD OF THE INVENTION

The present invention relates to light emitting diodes (LEDs) that utilize phosphors to convert a portion of the light generated by the LED.

BACKGROUND OF THE INVENTION

For the purposes of the present discussion, the present invention will be discussed in terms of a "white" emitting light-emitting diode (LED); however, the methods taught in the present invention can be applied to wide range of LEDs. A white emitting LED that emits light that is perceived by a human observer to be "white" can be constructed by making an LED that emits a combination of blue and yellow light in the proper ratio of intensities. High intensity blue-emitting LEDs are known to the art. Yellow light can be generated from the blue light by converting some of the blue photons via an appropriate phosphor. In one design, a transparent layer containing dispersed particles of the phosphor covers an LED chip. The phosphor particles are dispersed in a potting material that surrounds the light-emitting surfaces of the blue LED. To obtain a white emitting LED, the thickness and uniformity of the dispersed phosphor particles must be tightly controlled.

In one prior art method for constructing such a device, the phosphor is mixed with a resin material such as epoxy or silicone and the slurry is put over the LED chip. The phosphors are typically in the form of fine particles and usually have a distribution typically ranging from 1 um to 20 um. When the slurry is used to cover the LED chip, the phosphor particles are initially distributed throughout the coating layer and occupy a volume greater than the LED chip.

Such devices have a number of problems. First, if the resin does not cure quickly, the phosphor particles tend to settle, and hence, there is a non-uniform distribution of particles that often has a boundary between the region of the resin having the particles and the upper portions of the resin coating. This boundary can cause the coating to split into two layers at some point in the life of the light source.

Even if the resin sets before the particles have time to settle, the resulting light source is a three-dimensional source of a size that is much larger than the underlying LED chip. Such a source presents problems in applications in which an optical system must be used to image the light source onto an object that is to be illuminated. The light source is essentially a compound light source having a first point source that emits blue light and a broader diffuse source that emits the yellow light. Consider an optical system that images this compound source onto a scene that is to be illuminated with white light. To be perceived as white light, each area of the scene must receive the same amount of blue and yellow light. Consider a collimating lens that has the LED at its focal point. The blue light will be formed into a beam having a more or less uniform intensity. The yellow light will, in general, not be uniformly distributed across this beam, since the yellow light source is not at the focal point of the lens and consists of a broad three-dimensional source. Hence, a human observer will see a source that varies in color across the source.

SUMMARY OF THE INVENTION

The present invention includes a light emitting device having a light source that generates light of a first wavelength and a layer of phosphor particles covering the die. The phosphor particles convert at least a portion of the light of the first wavelength to light of a second wavelength. The layer of phosphor particles preferably has a thickness of less than 100 µm, and may include the residue of a slurry of the phosphor particles and a volatile solvent. The residue is the portion of the slurry that remains after the volatile solvent is driven off. In one embodiment, the light source is an LED. In one embodiment, a layer of clear encapsulating material covers the layer of phosphor particles. The encapsulating material can include a diffusing material for scattering light generated by the light source and the phosphor particles. In one embodiment, the die is located in the cup such that a portion of the light generated by the light source is reflected from the cup. The layer of phosphor particles covers a portion of the cup in this embodiment. In one embodiment, a clear layer is placed between the light source and the phosphor layer.

A light source according to the present invention can be fabricated by attaching the die having the light source to a substrate. A light converting layer that includes a volatile carrier material and particles of a phosphor that convert light of the first wavelength to light of the second wavelength is applied over the die. The volatile carrier material is then caused to evaporate thereby leaving a layer of the phosphor particles over the die. The light converting layer can also include a binder material for binding the phosphor particles to one another when the volatile carrier material is evaporated. In one embodiment, the carrier material includes epoxy resins, silicone, polyurethanes, polyvinyl acetates, cyanoacrylate, phathalate, glass, aluminum nitride or silicone dioxide. In one embodiment, the binder material includes a polymer that includes acrylic resin, di-butyl phathalate, diacetone alcohol, or tetra ethyl orthosilicate.

DETAILED DESCRIPTION OF THE PREFERRED EMBODIMENTS OF THE INVENTION

Figure 1:
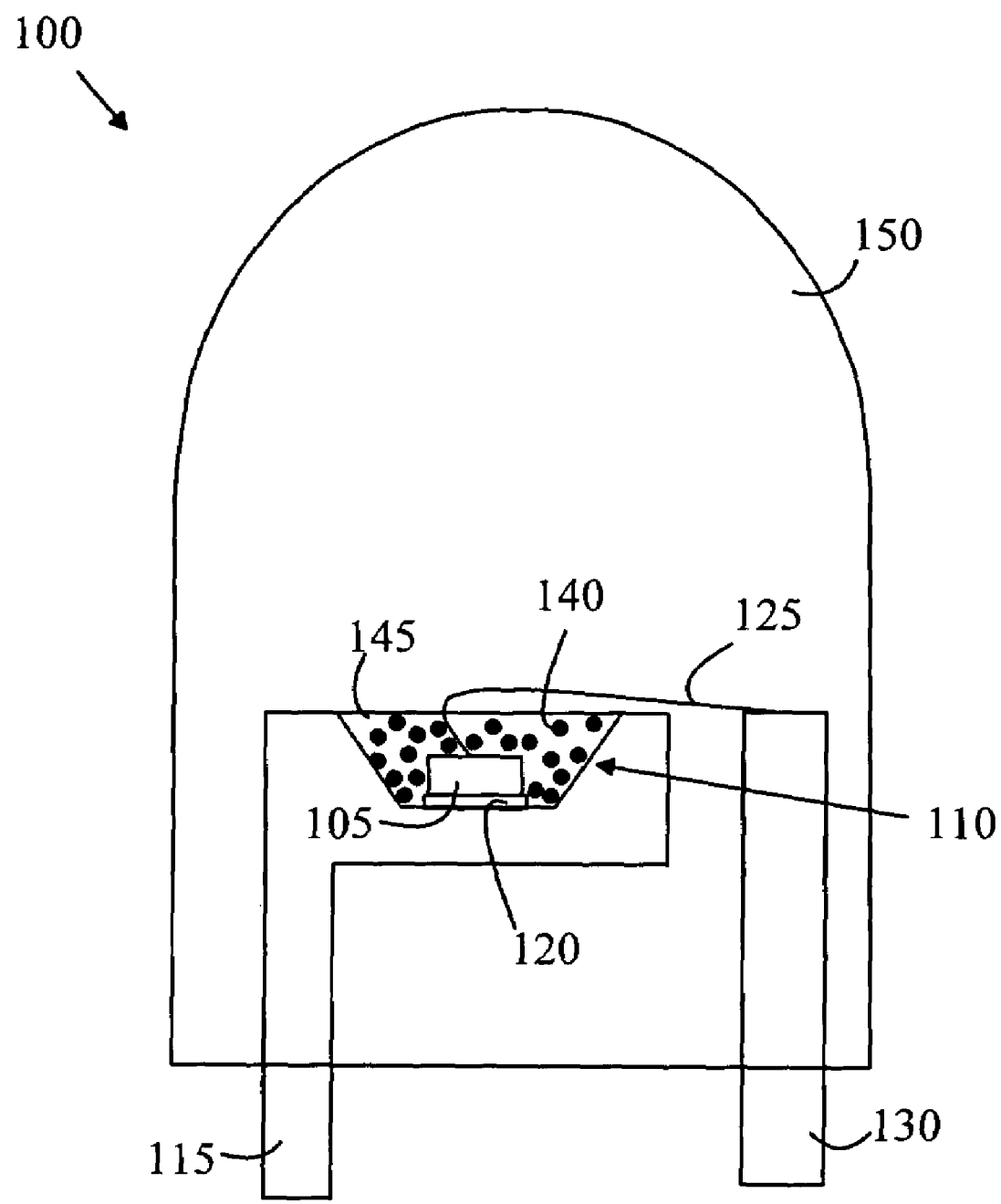
FIG. 1 is a cross-sectional view of a prior art LED light source that utilizes phosphor conversion.

The manner in which the present invention provides its advantages can be more easily understood with reference to FIG. 1, which is a cross-sectional view of a prior art LED light source that utilizes phosphor conversion. Light source 100 has an LED 105 mounted in a cavity 110 on the first terminal 115 of a substrate using an adhesive 120. An electrical connection 125 is made from one end of the LED to another terminal 130 of the substrate. A layer of coating is dispensed inside the cavity to cover the LED. The coating layer includes a mixture of phosphor 140 in an epoxy material 145. A clear epoxy 150 encapsulates the whole assembly forming an interface between it and the coating layer. Each phosphor particle acts as a point light source for light at the converted wavelength. Light that is not converted either escapes the phosphor layer without scattering, and hence, originates at a source below the phosphor particles or is scattered. The scattered light appears to originate from a more diffuse source of blue light.

The clear encapsulating plastic structure 150 can act as a lens and/or a lens is placed above the light source. In either case, the lens is presented with a number of different light sources at a variety of depths in the epoxy layer. Since the light color changes with depth, providing a uniform color at all points that are illuminated by the optical system is difficult.

The present invention overcomes this problem by confining the phosphor particles to a thin layer over the LED chip. In the proposed invention, a wavelength converting material such as phosphor is laid over the LED chip in a manner such that substantially all the phosphor particles are in contact with the LED chip and the walls of the cavity where the LED is mounted.

Figure 2:
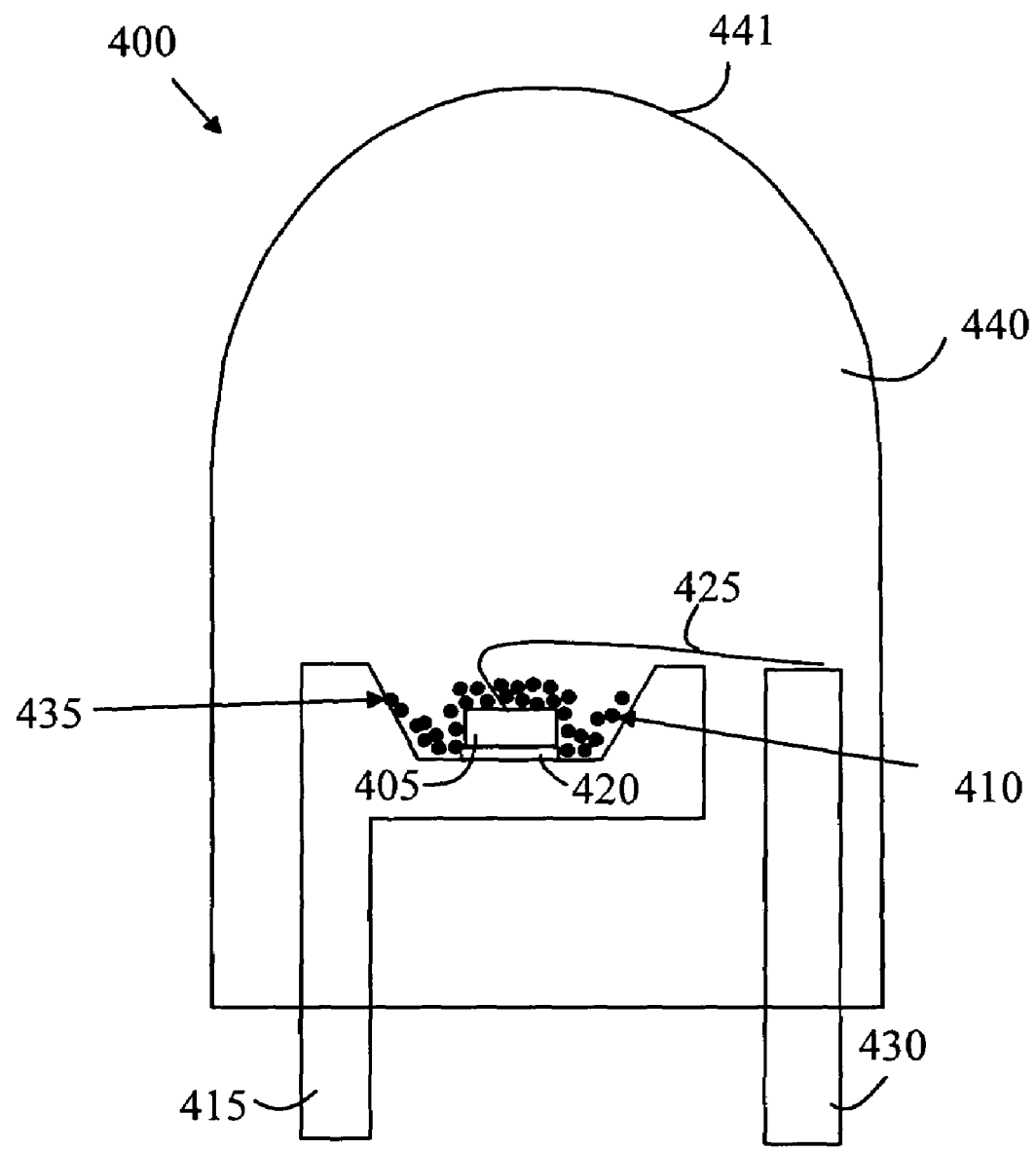
FIG. 2 illustrates a light-emitting device according to one embodiment of the invention.

Refer now to FIG. 2, which illustrates a light-emitting device according to one embodiment of the invention. Device 400 is analogous to device 100 shown in FIG. 1. Device 400 has an LED 405 mounted in a cavity 410 on the first terminal 415 of a substrate using an adhesive layer 420. An electrical connection 425 is made from one end of the LED to another terminal 430 of the substrate. A layer of phosphor 435 covers the LED and at least part of the walls of cavity 410. An encapsulate material 440 encapsulates the LED, phosphor layer, and part of the terminals. The encapsulate layer 440 is configured to provide a lens 441 in this embodiment of the present invention.

Figure 3:
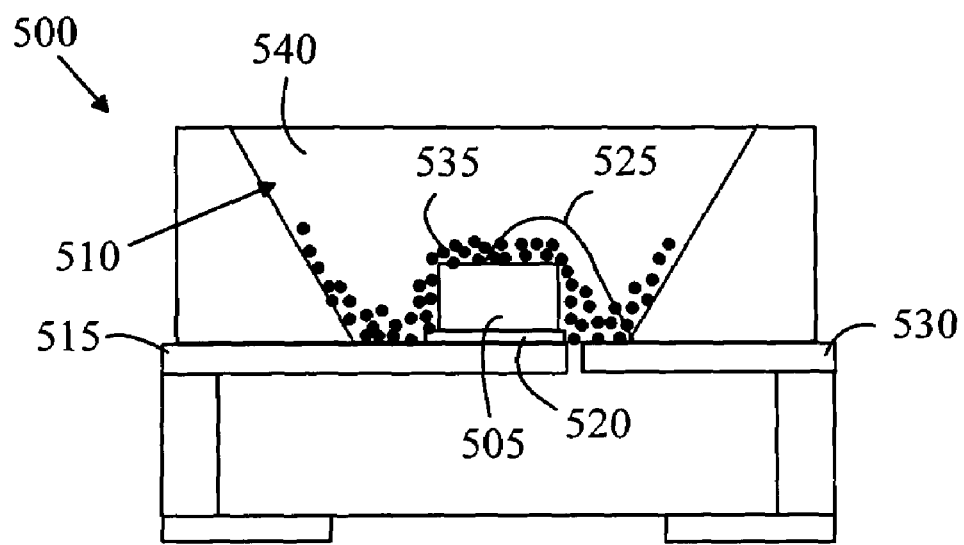
FIG. 3 is a cross-sectional view of another embodiment of a light source according to the present invention.

However, it should be noted that the lens function is optional. An embodiment without a lens is shown in FIG. 3, which is a cross-sectional view of another embodiment of a light source according to the present invention. Device 500 has an LED 505 mounted in a cavity 510 on a first terminal 515 of a substrate using an adhesive 520. An electrical connection 525 is made from one end of the LED to a second terminal 530 of the substrate. A layer of phosphor 535 covers the LED and partially covers the walls of the said cavity. An encapsulant material 540 encapsulates the LED covered with said phosphor and fills the cavity. The walls of cavity 510 preferably reflect the light generated by the LED and the phosphor, and hence, increase the light output as well as providing a collimating function.

Figure 4:
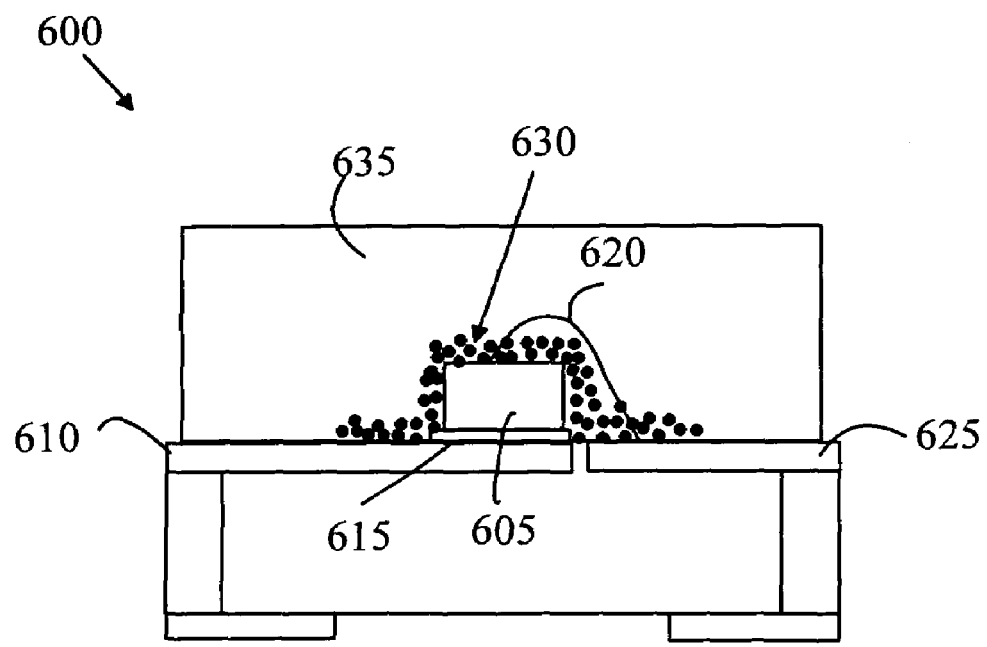
FIG. 4 is a cross-sectional view of another embodiment of a light source according to the present invention.

While the above embodiments utilize some form of reflecting well to improve the light efficiency of the light source, embodiments of the present invention that lack such a cavity can also be constructed. Refer now to FIG. 4, which is a cross-sectional view of another embodiment of a light source according to the present invention. Device 600 has an LED 605 mounted on a first terminal 610 of a substrate using an adhesive 615. An electrical connection 620 is made from one end of the LED to a second terminal 625 of the substrate. A layer of phosphor 630 covers the LED and a portion of the substrate. An encapsulant 635 encapsulates the LED covered with the phosphor on one side of the device.

The present invention utilizes a much thinner phosphor layer than prior devices. Therefore, the size of the light source comprising both the LED chip and the phosphor particles is smaller. This feature is useful when secondary optical systems are utilized to collimate or image the light from the light source.

In addition, the present invention can be used to create phosphor layers having multiple sub-layers. Each sub-layer can be deposited in the manner described above. The individual sub-layers can be formed from phosphor particles having different particle sizes and/or compositions. For example, the second sub-layer can be constructed from finer phosphor particles to provide more uniform coverage. In another example, the different sub-layers include phosphors that provide different wavelengths in the final output light generated by the light source.

In addition, a light source according to the present invention requires only a single layer of encapsulant. Hence, there is no interface of dissimilar material between the phosphor layer and the bulk encapsulant layer that can lead to delamination of the layers at the interface as discussed above.

Having explained the structure of a light source according to the present invention, the manner in which the light source is constructed will now be described in more detail. The present invention is constructed by covering the LED chip with a mixture of phosphor particles in a carrier material that can be treated to drive away a portion of the carrier material, and thus, leave a layer of phosphor particles behind. The phosphor particles are uniformly distributed in a layer of carrier material that is dispensed over the LED chip. The layer is baked to at least partially drive away the carrier material leaving behind a layer of phosphor. Consequently, the phosphor particles all settle down and are deposited around the LED chip and at least some portions of the cavity walls.

The carrier material preferably has a tacky texture so that the phosphor particles can adhere to one another and to the LED chip and cavity surfaces. Further, the carrier material preferably can be at least partially dried by baking at a temperature not more than 300 degrees C., more preferably at a temperature not more than 200 degrees C. Additionally, it is preferable that any residue left behind when the carrier material is driven off be transparent to visible light.

The carrier material can be an organic material or a polymer such as epoxy resins, silicone, polyurethanes, polyvinyl acetates, cyanoacrylate and phathalate. The carrier material can also be an inorganic material such aluminum nitride and silicone dioxide. For example, in one embodiment of the present invention, phosphor particles are mixed with silicone dioxide in a volatile solvent and the mixture dispensed or spun around the LED chip. The coated LED is then baked to drive off the volatiles leaving a layer of phosphor around the LED chip.

As noted above, the residue of the carrier material preferably also acts as an adhesive to bind the phosphor particles to one another and to the LED and surrounding surface. To provide this functionality, a binder material can be added to the carrier material. For example, one or more polymers can be added to the carrier material. Binder polymers comprising acrylic resin, di-butyl phathalate, diacetone alcohol, and tetra ethyl orthosilicate can be utilized for this purpose.

Figure 5:
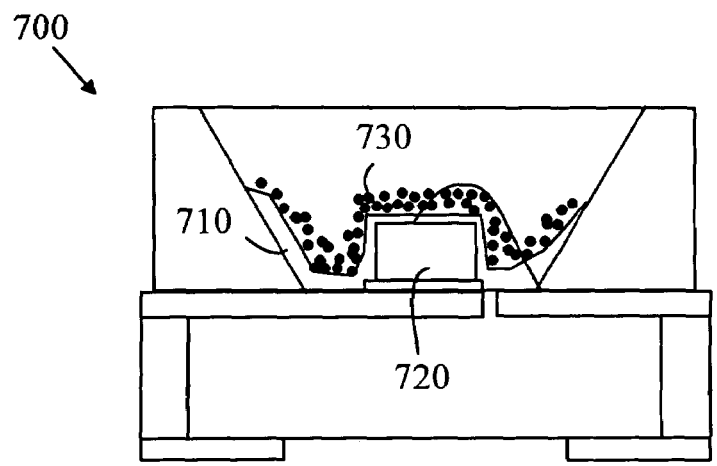
FIG. 5 is a cross-sectional view of another embodiment of a light source according to the present invention having a clear layer between the light source and the phosphor layer.

The above-described embodiments of the present invention utilize a phosphor layer that is formed on the LED chip and surrounding area. However, other configurations can also be utilized. For example, a transparent layer can be introduced between the LED chip and the phosphor layer. An embodiment of the present invention having such a layer is shown in FIG. 5. Light source 700 includes a transparent layer 710 that covers chip 720 and separates chip 720 from phosphor layer 730. Such a transparent layer can be used to prevent physical contact between the chip and the phosphor layer. In addition, the material used can be chosen to shield the phosphor layer from UV or heat generated in the chip.

Figure 6:
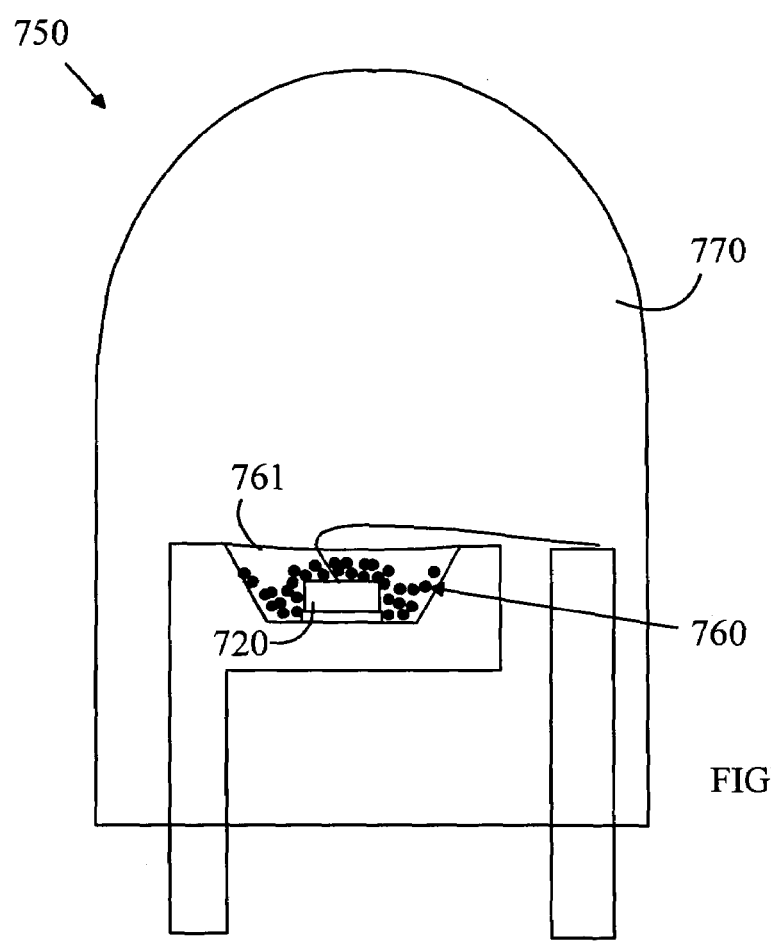
FIG. 6 is a cross-sectional view of another embodiment of a light source according to the present invention having a diffusing layer above the phosphor layer.

If a diffuse extended light source is required, a diffusing compound can be introduced into an epoxy layer that is placed over the phosphor layer prior to encapsulating the device in a clear bulk epoxy layer. An embodiment having such a diffusing layer is shown in FIG. 6. Referring to FIG. 6, light source 750 includes a chip 720 that is covered by a phosphor layer 760. A diffusion layer 761 is deposited on top of phosphor layer 760 prior to encapsulation by the bulk epoxy layer 770. Diffusion layer 761 can be constructed from a clear epoxy that has scattering particles dispersed therein.

The above-described embodiments of the present invention utilize an LED for the light source. However, embodiments of the present invention that utilize other light sources can also be constructed. For example, a light source based on a semiconductor laser could also be utilized.

To simplify the drawings and better explain the present invention, the above figures show layers of relatively large phosphor particles that are only a few particles thick. However, it is to be understood that the phosphor layers are actually uniform layers constructed from much smaller particles, and the layers are many particles thick.

Various modifications to the present invention will become apparent to those skilled in the art from the foregoing description and accompanying drawings. Accordingly, the present invention is to be limited solely by the scope of the following claims.

What is claimed is:

1. A light emitting device comprising:
a light source that generates light of a first wavelength, said light source comprising a die that emits light at said first wavelength;
a conformal layer of phosphor particles covering said die and in direct contact therewith, said phosphor particles converting at least a portion of said light of said first wavelength to light of a second wavelength, said layer having a substantially uniform thickness of less than 100 μm over said die; and
a reflecting cup comprising reflective sidewalls, said die being located in said cup such that a portion of said light generated by said die is reflected from said cup, said layer of phosphor particles covering a portion of said reflective sidewalls.

2. A light emitting device comprising:
a light source that generates light of a first wavelength; and
a layer of phosphor particles covering said light source, said phosphor particles converting at least a portion of said light of said first wavelength to light of a second wavelength, said layer comprising a residue of a slurry of said phosphor particles in a volatile solvent, said residue comprising the portion of said slurry that remains when a portion of said volatile solvent is removed.

3. The light emitting device of claim 2 wherein said light source comprises an LED.

4. The light emitting device of claim 2 further comprising a layer of clear material covering said layer of phosphor particles.

5. The light emitting device of claim 4 wherein said clear material further comprises a diffusing material for scattering light generated by said light source and said phosphor particles.

6. The light emitting device of claim 5 further comprising a layer of transparent bulk encapsulating material over said layer of clear material.

7. The light emitting device of claim 2 further comprising a reflecting cup comprising reflective sidewalls, a die located in said cup such that a portion of said light generated by said die is reflected from said cup, said layer of phosphor particles covering a portion of said reflective sidewalls.

8. The light emitting device of claim 2 further comprising a layer of clear material between said light source and said layer of phosphor particles.

* * * * *